United States Patent
Cummings et al.

(10) Patent No.: US 6,307,377 B1
(45) Date of Patent: Oct. 23, 2001

(54) BATTERY CHARGE DETERMINATION

(75) Inventors: John A. Cummings, Round Rock; Barry K. Kates, Austin, both of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/434,536

(22) Filed: Nov. 5, 1999

(51) Int. Cl.$^7$ .............................. H02J 7/04; G01N 27/416
(52) U.S. Cl. ................................... 324/427; 320/136
(58) Field of Search ................................. 320/136, 134, 320/132; 324/430, 426

(56) References Cited

U.S. PATENT DOCUMENTS

| | | | |
|---|---|---|---|
| 5,268,845 | 12/1993 | Startup et al. ..................... | 364/483 |
| 5,365,453 | 11/1994 | Startup et al. ..................... | 364/481 |
| 5,576,609 | 11/1996 | Brown et al. ....................... | 320/30 |
| 5,627,453 | 5/1997 | Sheehan et al. ................... | 320/30 |
| 5,691,742 | 11/1997 | O'Connor et al. ................. | 345/116 |
| 5,698,964 | 12/1997 | Kates et al. ........................ | 320/22 |
| 5,936,383 * | 8/1999 | Ng et al. ............................ | 320/132 |
| 6,163,133 * | 12/2000 | Laig-Horsetebrock ............ | 320/132 |

OTHER PUBLICATIONS

John A. Cummings, "Self Discharge Of Li–Ion Batteries At High Temperatures", Dec. 12, 1997; Ser. No. 08/989,605. (Copy not enclosed.).

Barry K. Kates, John A. Cummings, "Reverse Current Protection/Current Overshoot Control For Two Quadrant Battery Chargers", Jan. 22, 1999; Ser. No. 09/236,136. (Copy not enclosed.).

John A. Cummings, Barry K. Kates, "Adaptive Multiple Battery Charging Apparatus", Jan. 22, 1999; Ser. No. 09/236,165. (Copy not enclosed.).

* cited by examiner

Primary Examiner—Gregory J. Toatley, Jr.
(74) Attorney, Agent, or Firm—Skjerven Morrill MacPherson LLP; John A. Odozynski

(57) ABSTRACT

A battery charge determination device including at least one battery cell voltage measurement device, at least one battery cell internal resistance measurement device, and at least one battery charge assessment device operably connected to the at least one battery cell voltage measurement device and the at least one battery cell internal resistance measurement device.

29 Claims, 5 Drawing Sheets

BATTERY CHARGE DETERMINATION

BACKGROUND OF THE INVENTION

1. Field of the Invention

The present invention relates, in general, to data processing systems.

2. Description of the Related Art

Data processing systems are systems that manipulate, process, and store data and are notorious within the art. Personal computer systems, and their associated subsystems, constitute well known species of data processing systems.

One particularly popular type of personal computer system is the portable computer system (e.g., laptop, notebook, sub-notebook, and palm-held computer systems). Portable computer systems allow stand-alone computing and typically have their own power-supplies, modems, and storage devices.

In order to allow maximum flexibility of use, portable computer systems typically utilize a "mix" of different types of power supplies. For example, a portable computer system typically has at least one external power supply adapter (e.g., an AC-DC adapter, or a cigarette lighter adapter), which will allow the portable computer to be powered from an external power outlet such as an AC wall outlet, or a cigarette lighter outlet in an automobile. In addition, a portable computer system typically has at least one rechargeable battery, which serves as an internal power supply and which allows the portable computer system to be powered up and used in remote locations where no external power supplies are present.

Loss of power to a data processing system can be a catastrophic event. For example, if power is lost while a personal computer user is working on a critical document (such as an engineering schematic) stored in the Random Access Memory (RAM) of the computer, the data in the RAM is typically lost.

When a portable computer system is utilizing battery power in a location where no external power supply is readily available, loss of power due to an expended battery can be catastrophic. Accordingly, most portable computer systems provide special battery monitoring equipment (e.g., hardware and/or software and/or firmware) which gauges how much battery power the portable computer systems have at any particular point in time. Additionally, in an effort to avoid a catastrophic loss of data due to loss of power arising from an expended battery, power down utilities (e.g., programs) observe the special battery monitoring equipment and automatically perform a "suspend to disk" (i.e., save the state of the personal computer to disk) and subsequent immediate power down when battery power is sensed as being at a dangerously low level.

One common type of special battery monitoring equipment is known in the art as a "coulomb counter," which essentially keeps track of the inflow and outflow of electric energy from a battery. Batteries store energy in the form of electric charges, which are typically denoted in units of coulombs. A coulomb counter first determines the number of coulombs which are "loaded" into a battery by a battery charger. The charge loaded into the battery is typically determined by multiplying measured average current, delivered by the battery charger to the battery by the time interval, expressed in seconds, during which the measured average current was delivered. That is, since one ampere is roughly one coulomb per second, the net charge transferred can be roughly calculated by multiplying average charger-to-battery current by the time it was flowing (e.g., coulombs=seconds×coulombs/second). Thereafter, the coulomb counter keeps a running aggregate total of the charge extracted from the battery using the same coulomb counting mechanism. That is, an aggregate count is kept of charge leaving the battery where the charge leaving the battery during any interval of time is calculated by multiplying measured average current out of the battery by the time the current is flowing out of the battery. Since an aggregate count is kept of the charge leaving the battery, the coulomb counter can be used to alert the system when charge out of the battery is approaching the charge loaded into the battery.

Notice that the foregoing is not actually measuring charge in the battery, but is merely assuming that a battery contains a total charge delivered during an interval of charging. It is very common for a partially charged battery to be connected to a battery charger. Since the battery already contains a certain amount of stored charge, the coulombs "in," as read by the coulomb counter, will actually be less than the charge ultimately stored in battery (because the battery has this charge in, plus the battery's initial partial stored charge). It has been found empirically that repeated occurrences of the foregoing scenario (charging a partially charged battery) can "confuse" the coulomb counter as to the actual amount of charge available, which can lead to malfunctions (e.g., showing a low battery condition when none in fact exists, or, in some instances, immediately suspending to disk when battery power is accessed, essentially rendering the system's battery unusable).

Another type of problem that can occur with special battery monitoring equipment utilizing coulomb counting is related to loss of capacity as a battery ages. Those skilled in the art will recognize that a battery stored at full charge over a long period of time will typically lose its ability to store charge. Consequently, whereas the coulomb count into the battery might indicate that a given amount of charge is available in the battery, in point of fact, due to aging and physical changes within the battery, the actual charge which can be ejected from the battery is actually much less.

Accordingly, the decreased capacity battery will actually run out of energy while the coulomb counter still shows plenty of charge resident within the battery. This can cause loss of power with relatively no warning, which can be catastrophic in a data processing system context.

Another common type of special battery monitoring equipment keys off the voltage of the battery. That is, when the voltage drops to a certain pre-specified level, special battery monitoring equipment assumes a low power condition exists. This type of special battery monitoring equipment is particularly prone to error in that variability in batteries can result in a relatively low battery voltage, when in fact a significant amount of energy is still stored in the battery. Thus, a low battery condition may be detected when in fact there is actually plenty of energy stored in the battery. The converse is also true, for reasons similar to those discussed above. That is, the battery might show a fully charged voltage, but, due to loss of capacity associated with aging, run out of energy even though its measured voltage is within tolerance.

Accordingly, it is apparent from the foregoing that there is a need in the art for method and device which give an accurate assessment of energy stored in a battery, such as a data processing system battery.

SUMMARY OF THE INVENTION

A method and device have been discovered which give an accurate assessment of energy stored in a battery, such as a data processing system battery. In one embodiment, a method for determining stored charge in a battery includes but is not limited to measuring an internal resistance of a battery cell, measuring a voltage of the battery cell, and, assessing—in response to the internal resistance and voltage of the battery cell—the charge stored in the battery.

In one embodiment, a battery charge determination device includes, but is not limited to, at least one battery cell voltage measurement device, at least one battery cell internal resistance measurement device, and at least one battery charge assessment device operably connected to the at least one battery cell voltage measurement device and the at least one battery cell internal resistance measurement device.

In one embodiment, a data processing system includes, but is not limited to, at least one battery operably coupled to the data processing system, and a battery charge determination device which includes but is not limited to (1) at least one battery cell voltage measurement device, and (2) at least one battery cell internal resistance measurement device, and (3) at least one battery charge assessment device operably connected to the at least one battery cell voltage measurement device and the at least one battery cell internal resistance measurement device.

In one embodiment, a method of manufacturing a battery charge determination device includes, but is not limited to, operably coupling a voltage waveform generator to a first battery cell terminal, connecting voltage measuring circuitry to the first battery cell terminal, and operably coupling a current sensing device to a second battery cell terminal.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The following sets forth a detailed description of a mode for carrying out embodiments described. The description is intended to be illustrative of the invention and should not be taken to be limiting.

Figure 1:
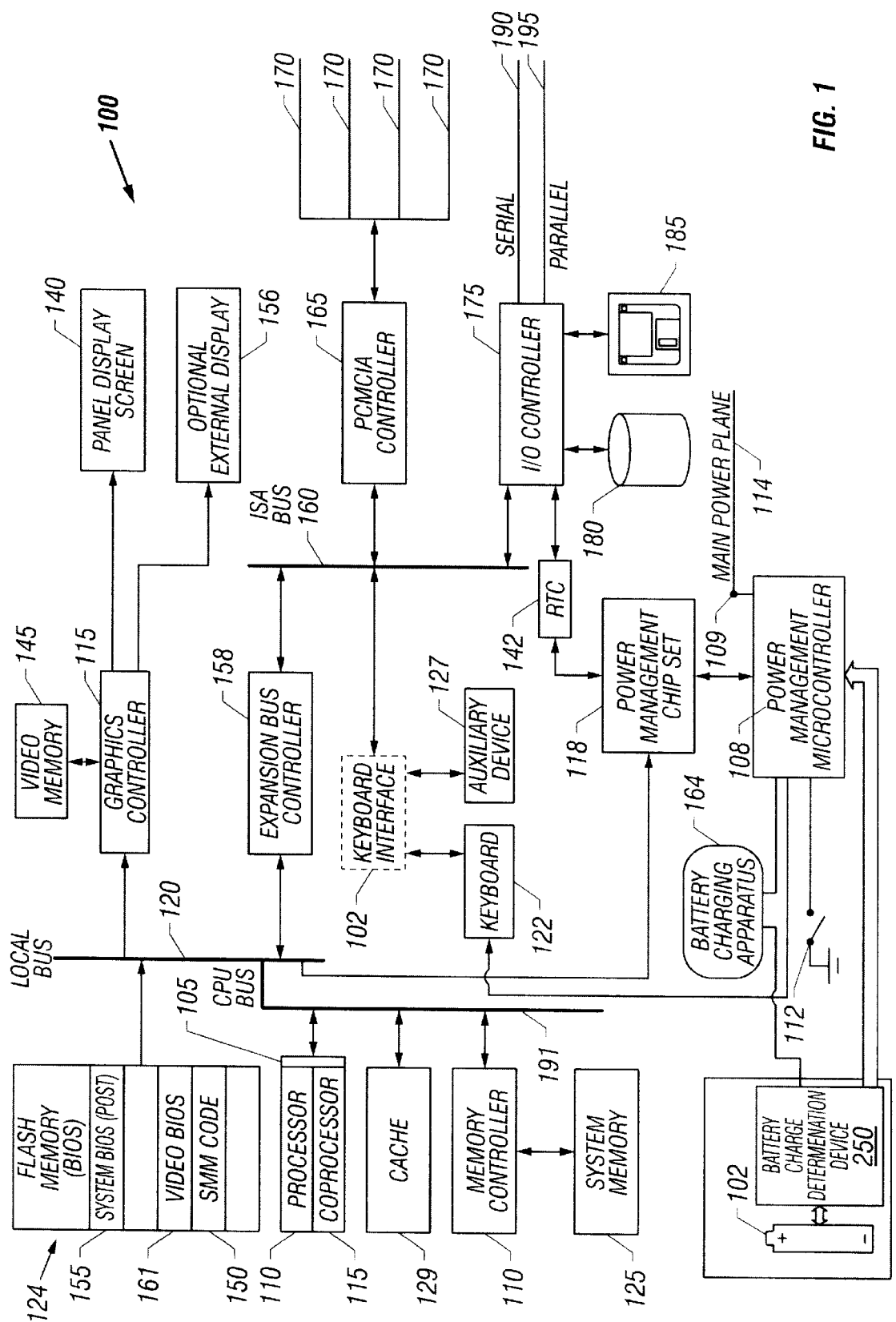
FIG. 1 depicts data processing system 100 in which an embodiment of the present invention may be practiced.

Referring to FIG. 1, depicted is data processing system 100 in which an embodiment of the present invention may be practiced. Data processing system 100 includes microprocessor 105 which is coupled to cache 129 and memory controller 110 via the processor bus ("CPU bus") 191. Data processing system 100 also includes system memory 125 of dynamic random access memory ("DRAM") modules (not shown) coupled to memory controller 110. Data processing system 100 also includes Basic Input Output System ("BIOS") memory 124 (which can contain many types of data, such as system BIOS 155, video BIOS 161, and/or SMM code 150) coupled to local bus 120. A FLASH memory or other nonvolatile memory is used as BIOS memory 124. BIOS memory stores the system code.

Graphics controller 115 is coupled to local bus 120 and to panel display screen 140. Graphics controller 115 is coupled to video memory 145 and stores information to be displayed on panel display screen 140. Panel display 140 is typically an active matrix or passive matrix liquid crystal display ("LCD") although other display technologies may be used as well. Also shown is graphics controller 115 coupled to optional external display 156.

Bus interface controller or expansion bus controller 158 couples local bus 120 to an expansion bus, shown as an Industry Standard Architecture ("ISA") bus, but which could be represented as a Peripheral Component Interconnect ("PCI") bus. PCMCIA ("Personal Computer Memory Card International Association") controller 165 is also coupled to expansion bus 160 and PCMCIA devices 170. I/O controller 175 is coupled to expansion bus 160 as well. I/O controller 175 interfaces to Integrated Drive Electronics ("IDE") hard drive 180 and to floppy drive 185. Keyboard Interface 102 is coupled to expansion bus 160 and further is coupled to keyboard 122 and auxiliary device 127; alternatively, keyboard 122 and auxiliary device 127 are shown to couple directly to expansion bus 160.

Data processing system 100 includes battery charge determination device 250, which monitors charge stored in battery 102, which may be a single cell or multi-cell battery. Depicted is that battery charge determination device 250 is in communication with power management microcontroller 108. Battery charge determination device 250 determines the charge stored in battery 102 and outputs that charged stored information to various recipients that have need for such information (e.g., a battery power display device, a program which creates a graphical icon on panel display screen 140, or a power management entity that monitors for a low battery condition and performs automatic powerdown) by and through power management microcontroller 108 (although many other types of data paths and connections are possible). It will be appreciated in the art that data processing system 100 could be other types of computer systems, such as desktop, workstation, or network server computers. However, in the embodiment shown data processing system 100 is depicted as a portable or notebook computer. Thus, battery 102 would typically be a rechargeable battery, such as Nickel Cadmium ("NiCad"), Nickel Metal Hydride ("NiMH"), or Lithium-Ion ("Li-Ion"). Power management microcontroller 108 controls the distribution of power to different devices. Power management microcontroller 108 is coupled to main power switch 112 that the user actuates to turn the computer system on and off. When power management microcontroller 108 powers down other parts the of data processing system 100 to conserve power, power management microcontroller 108 remains coupled to a source of power.

Power management microcontroller 108 is coupled to battery charging apparatus 164. Battery charging apparatus 164 is coupled to battery charge determination device 250. Battery charging apparatus 164 is capable of charging battery 102. Power management microcontroller 108 couples to power management chip set 118, which couples to Real Time Clock (RTC) 142, which couples to I/O controller 175.

Figure 2:
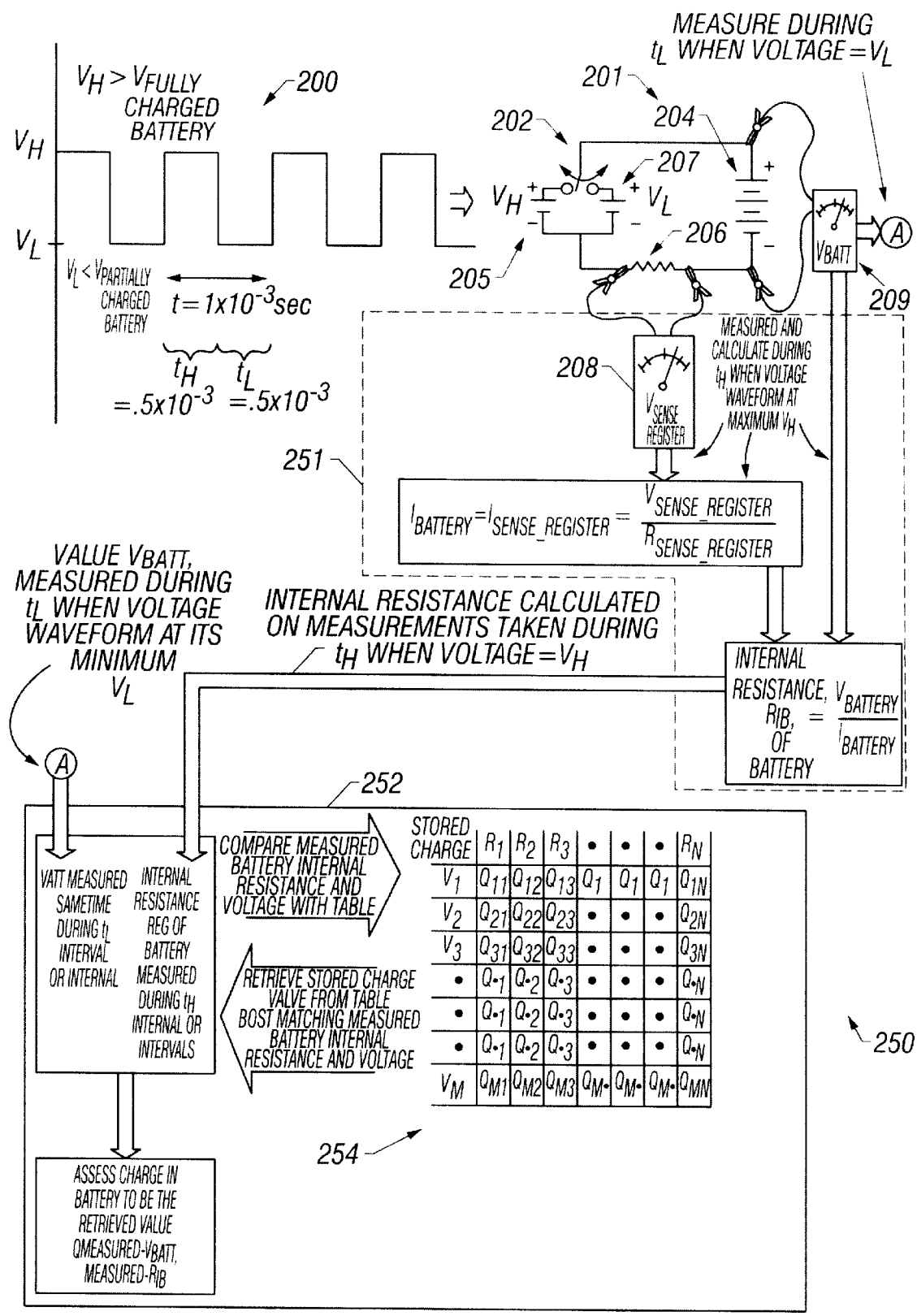
FIG. 2 shows a partially schematic idealized representation of battery charge determination device 250 which determines the charge of battery cell 204 utilizing battery cell's 204 measured internal resistance and voltage.

Referring now to FIG. 2, shown is a partially schematic idealized representation of battery charge determination device 250 which determines the charge of battery cell 204 utilizing battery cell's 204 measured internal resistance and voltage. Shown is voltage waveform 200, which is depicted as an idealized 1 KHz square wave with a duty cycle of 50%. For sake of illustration, voltage waveform 200 is depicted as being generated by switch 202 within circuit 201.

During the first half of its duty cycle, $t_H$, voltage waveform 200 is shown to be at source voltage $V_H$, which is at some voltage in excess of the charged voltage, $V_{batt}$, on battery cell 204. During $t_h$, while voltage waveform 200 is at its maximum $V_H$, battery cell internal resistance measurement device 251 measures the internal resistance of battery cell 204. In one embodiment, this is accomplished as follows.

Voltage waveform 200, during the first half of the duty cycle, is shown to be at its maximum $V_H$, which for sake of illustration is depicted as source 205 voltage $V_H$ in circuit 201; $V_H$ is some voltage higher than the expected maximum charge voltage on battery cell 204. Since $V_H$ is higher than $V_{batt}$ current will flow from source 205 of voltage $V_H$, through battery cell 204, then through sense resistor 206, and then back into the negative terminal of source 205 of voltage $V_H$. Voltmeter 208, which is depicted as having relatively infinite impedance (and thus relatively no effect on the operation of circuit 201), measures the voltage across sense resistor 206. Thereafter, since the resistance of sense resistor 206 and the voltage across sense resistor 206 are known, shown is that the current through sense resistor 206 can be calculated. Substantially simultaneously with the foregoing measurements and subsequent calculations (i.e., during $t_H$ where voltage waveform 200 has value $V_H$), voltmeter 209 measures voltage, $B_{batt}$, across battery cell 204. Thereafter, shown is that since the same current in sense resistor 206 flows through series connected battery cell 204, the measured voltage, $V_{batt}$, across battery cell 204 can be used to calculate the internal resistance, $R_{IB}$, of battery cell 204. Depicted is that the calculated internal resistance, $_{RIB}$, is delivered to battery charge assessment device 252.

During the second half of its duty cycle, $t_L$, voltage waveform 200 is shown to be at its minimum, which for sake of illustration is depicted as source 207 voltage $V_L$ in circuit 201; $V_L$ is some voltage less than the expected minimum charged voltage on battery cell 204. During the second half of the duty cycle of voltage waveform 200, since source 207 voltage $V_L$ is at a voltage lower than $B_{batt}$, depicted is that current will flow from the positive terminal of $B_{batt}$, through source 207 of voltage $V_L$, then through sense resistor 206, and then back into the negative terminal of battery cell 204. At some point during $t_L$, while voltage waveform 200 is at its minimum $V_L$, voltmeter 209 is used to measure the voltage $V_{batt}$ on battery cell 204. (It has been found empirically that measuring $V_{batt}$ battery cell 204 as described, when driven by an alternating current such as that generated by voltage waveform 200, is much more likely to actually capture the true charge voltage on battery cell 204. One reason for this is that driving the battery with an alternating current such as that generated by voltage waveform 200 (which in one embodiment is a 1 KHz square wave) tends to alleviate the problems associated with "polarization" (an increase or decrease in battery voltage not due to actual stored energy in a battery, particularly apparent in Lithium-Ion batteries) in that the alternating current waveform allows the voltage on battery cell 204 to be measured before the battery has a chance to polarize.) Subsequent to measurement, the measured voltage of battery cell 204 is delivered to battery charge assessment device 252.

Illustrated is that the internal resistance of battery cell 204 and the measured voltage of battery cell 204 are delivered to battery charge assessment device 252. Thereafter, shown is that battery charge assessment device 252 compares the measured voltage and measured internal resistance of battery cell 204 with tabular data set 254 having row and column entries correlating measured battery voltage and internal resistance with charge actually stored in a battery (in one embodiment, tabular data set 254 is stored in a memory associated with battery cell 204). Depicted is that battery charge assessment device 252 retrieves from the table the stored charge value residing in the row (Voltage) and column (Resistance) entry which best match with the measured voltage, $V_{batt}$, and measured internal resistance, $R_{IB}$, of battery cell 204. Thereafter, shown is that battery charge assessment device 252 assesses the stored charge in battery cell 204 to be the retrieved charge $Q_{row, column}$. Battery charge assessment device 252 thereafter outputs the value of the stored charge in battery cell 204 to a component of a data processing system sensitive to the stored charge in the battery, such as a display device which tracks and displays the stored charge in the battery, an application problem driving a display device showing the stored charge in the battery, or a battery charge monitoring program which detects a low battery condition and shuts down a data processing system to avoid lost data.

In an idealized situation, the measured voltages and resistances of battery cell 204 in response to both voltage $V_H$ and $V_L$ would always be the same. However, those skilled in the art will appreciate that in a real-world (as opposed to a mathematically ideal circuit) the measured voltages and resistances can vary in response to voltage $V_H$ and $V_L$, and can even vary across duty cycles. Accordingly, the measured voltages and resistances of battery cell 204 can be gathered across several duty cycles to generate some type of average of the measured voltages and internal resistances of battery cell 204. The exact number of duty cycles used to do this is a design choice within the purview of the system designer.

Figure 3:
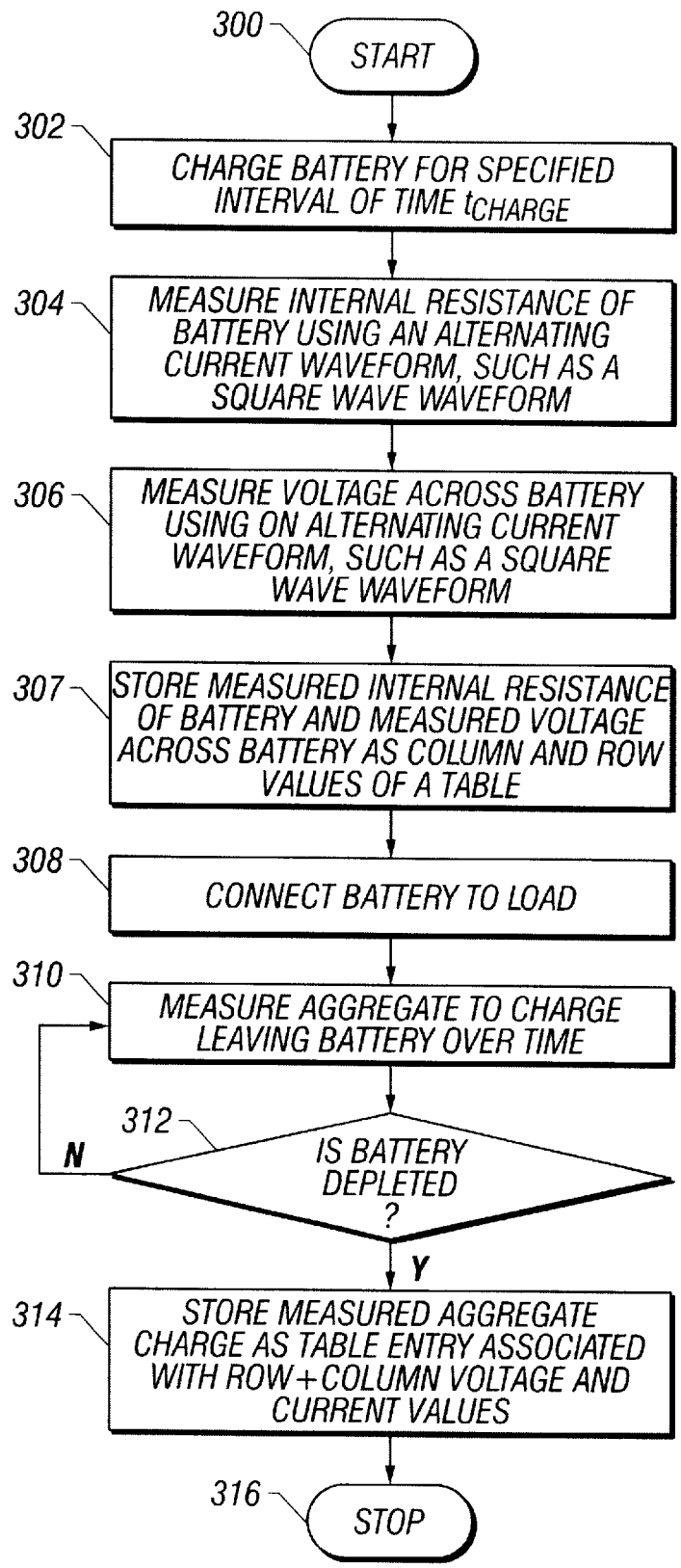
FIG. 3 depicts a high-level logic flowchart which can be used to obtain and construct tabular data set 254, as shown in FIG. 2.

With reference now to FIG. 3, depicted is a high-level logic flowchart which can be used to obtain and construct tabular data set 254, as shown in FIG. 2. Method step 300 shows the start of the process. Method step 302 depicts the charging of a battery for some interval of time $t_{charge}$ (e.g., for the interval of time required to charge the battery to its maximum charged value). Method step 304 shows measuring the internal resistance of the battery as described in relation to FIG. 2 (i.e., measuring the internal resistance of the battery during the maximum value $V_H$ of a square wave waveform). Method step 306 illustrates measuring the voltage of the charged battery as described in relation to FIG. 2 (i.e., measuring the voltage across the battery during the minimum value $V_L$ of a square wave waveform).

Once the voltage of the charged battery and the internal resistance of the charged battery have been measured, method step 307 shows that the measured voltage and internal resistance of the charged battery are stored in a table, often in a memory (e.g., a RAM or ROM) which is integrated into a case containing the battery. Thereafter, method step 308 illustrates connecting the charged battery to a load similar to a load (e.g., data processing system 100) expected to be driven by the battery in an everyday environment and simultaneously starting a timer. Method step 310 shows measuring the aggregate charge leaving the battery, which in one embodiment is accomplished via coulomb counting.

Method step 312 depicts determining if the battery has been depleted (e.g., has battery power dropped to such a low level that data processing system 100 being driven by the battery can no longer perform specified actions, such as accessing the hard drive). In the event that the battery has not been depleted, the process "loops" back to method step 310.

In the event that the inquiry of method step 312 indicates that the battery has been depleted, the process proceeds to method step 314, which shows that the recorded aggregate charge which has left the battery during discharge is recorded as the tabular entry associated with the measured internal resistance of the battery and measured voltage on the battery which were illustrated as being stored as row and column values in method step 307. Thereafter, method step 316 depicts that the process stops.

In one implementation, the foregoing described process of FIG. 3 is repeated for varying values (i.e., for varying periods of time the battery is on the charger) of charge within the battery. The actual number of values obtained is a design choice within the purview of the system designer. However, upon completion of the series of tests, the results will be such that an internal impedance and voltage on the battery can be paired with the charge in the battery. Such information allows the accurate "gauging" of charge left in the battery in a manner which will be described in relation to FIG. 4, below. In another embodiment, the stored charge values are obtained by (1) fully charging a battery, (2) measuring and recording the voltage and internal resistance of the battery, and (3) incrementally discharging the battery, with measured battery internal impedance and voltage being recorded after each incremental discharge. A coulomb counter (which typically is not a separate counter, but rather amounts to starting another count, associated with the measured voltage and internal resistance of the battery after the incremental discharge, at zero) is started after each incremental discharge and associated with the measured battery internal resistance and voltage which are measured immediately subsequent to the incremental discharge; all such coulomb counters (i.e., those associated with particular measured values of battery internal resistance and voltage) are allowed to run until the battery is completely discharged. Thus, at the end of one discharge, the table correlating measured internal resistances and measured battery voltages can be constructed since each of the individual coulomb counters will have contained a measured coulomb count for each measured value of the internal resistance of the battery and the voltage of the battery which were taken at the end of each incremental discharge.

While the alternate method of charging usually allows the table to be constructed in a shorter period of time, the process in FIG. 3 was presented in that it is easier to understand and because it will tend to produce a somewhat more accurate count of energy discharged, since it avoids leakage while measurements are taken during the alternative incremental discharge process.

Figure 4:
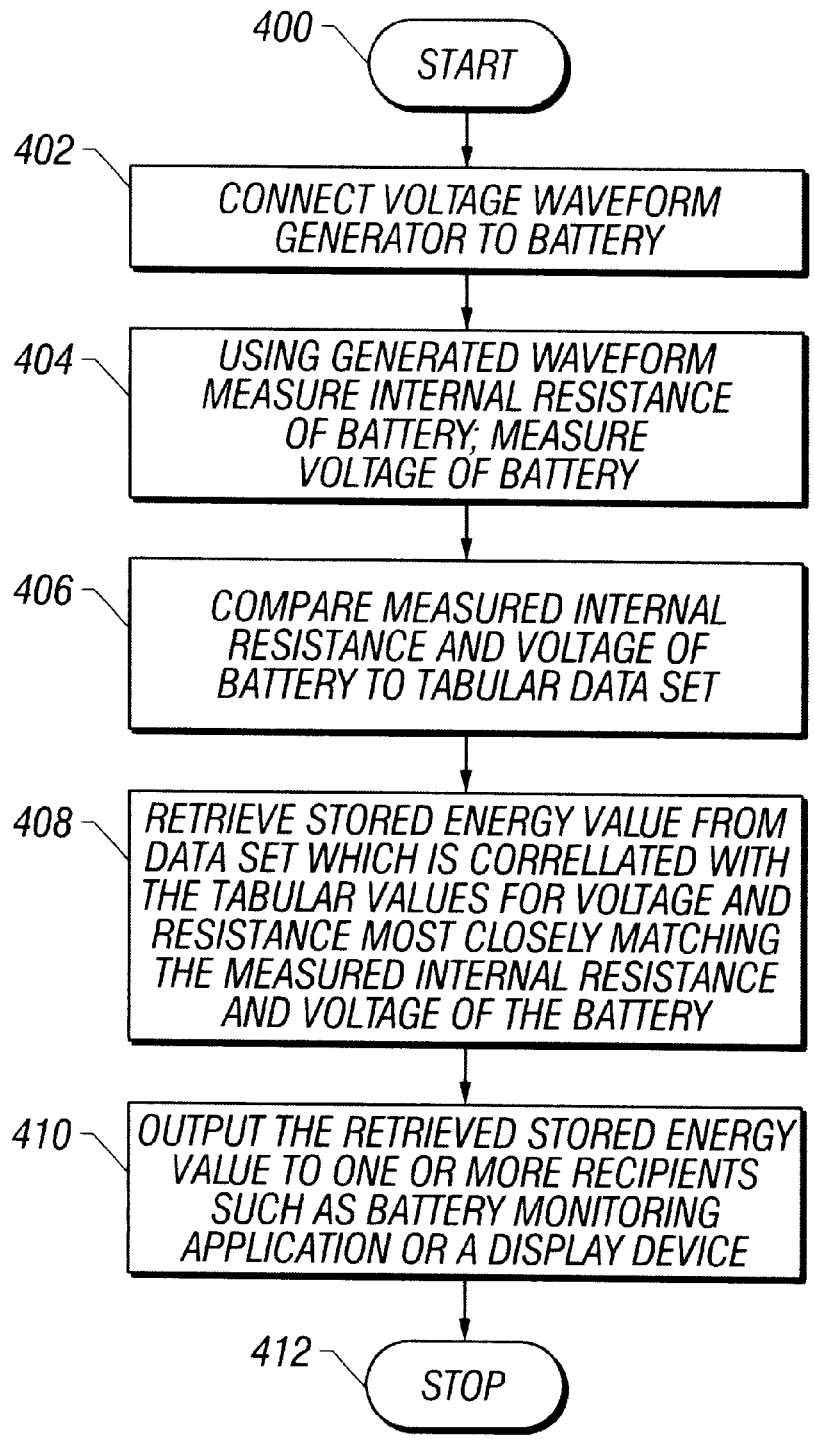
FIG. 4 illustrates a high-level logic flowchart which shows how one embodiment of the data gathered via the process(es) described with respect to FIG. 3 and the measurements described with respect to FIG. 2 can be utilized to give an accurate gauge of battery energy available.

Referring now to FIG. 4, depicted is a high-level logic flowchart which shows how in one embodiment the data gathered via the process(es) described with respect to FIG. 3, and the measurements described with respect to FIG. 2, can be utilized to give an accurate gauge of battery energy available. Method step 400 shows the start of the process. Method step 402 depicts the step of connecting a voltage waveform generator, capable of generating a voltage waveform such as voltage waveform 200 to a battery (such as battery cell 204). Method step 404 illustrates that, subsequent to the connection of the voltage waveform generator to the battery, measurements analogous to those described in relation to FIG. 2 are taken of the internal resistance and voltage of the battery. Thereafter, method step 406 shows that the measured internal resistance and voltage of the battery are compared to a table of data containing data coordinating a measured voltage and resistance of a battery with the amount of energy stored in the battery (e.g., tabular data set 254). Method step 408 depicts that the energy stored is retrieved from the table entry having values most closely approximating the measured voltage and resistance of the battery. Method step 410 illustrates that the retrieved energy stored amount is then output; the output can be delivered to many different recipients, such as a display, another program driving a display (e.g., a gas gauge graphical user interface program), or a program monitoring the system for low battery conditions. Thereafter, method step 412 shows the end of the process.

Figure 5:
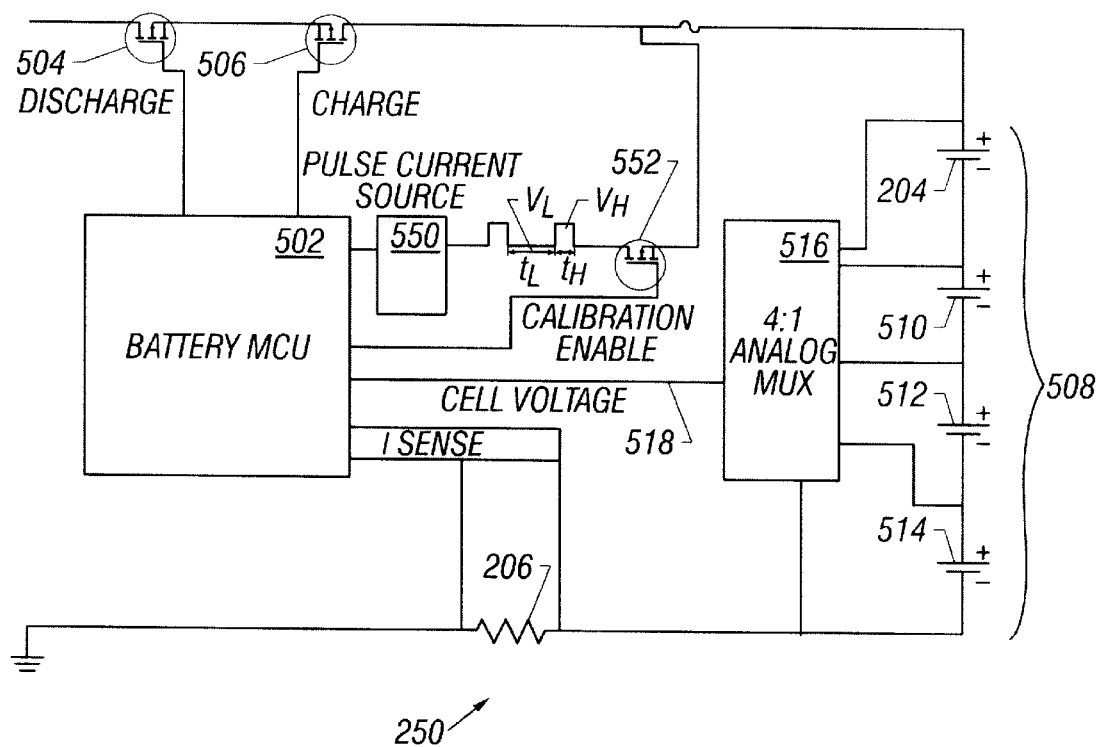
FIG. 5 shows a highlevel schematic diagram showing an alternative embodiment of battery charge determination device 250 where the alternative embodiment provides for determining battery charge in batteries composed of one or more cells.

With reference now to FIG. 5, shown is a high-level schematic diagram showing alternative battery charge determination device 250 for determining battery charge in batteries composed one or more cells. Depicted is battery Microcontroller Unit (MCU) 502 which provides control to the various aspects of the circuit shown as will now be described. Shown is that MCU 502 is connected to discharge control power Field Effect Transistor (FET) 504 and charge control power FET 506. These FETs 504 and 506 are typically used to control the charging or discharging of battery 508 composed of cells 204, 510, 512, and 514 arranged in series. However, in order to determine the charge of battery 508, discharge control power FET 504 and charge control power BET 506 are both turned off, thereby isolating alternative battery charge determination device 250 from the ordinary loading and charging circuitry (not shown) of battery 508.

With battery charge determination device 250 so isolated, calibration enable FET 552 is activated such that pulse current source 550, which produces a squarewave waveform analogous to waveform 200, except that in this instance $V_H$ is to be higher than the highest expected charged voltage of battery 508 (i.e., the entire series combination of voltages on cells 204, 510, 512, and 514) and $V_L$ is to be less than the lowest expected charge voltage of battery 508 (i.e., the entire series combination of voltages on cells 204, 510, 512, and 514). Pulse current source 550, through activated calibration enable FET 552 is connected to the positive terminal of battery 508. Thereafter, the voltage and internal resistance of each of cells 204, 510, 512, and 514 of battery 508 are sequentially tested (battery cell 204 is depicted as being a cell of battery 508 for ease of understanding and for easily coordinating the discussion of the circuit of FIG. 5 with the discussion of the circuit of FIG. 2). This is done by essentially repeating the testing process described in relation to FIG. 5 for each of the individual cells 204, 510, 512, and 514 of battery 508. For example, to test battery 508, MCU 502 during a time interval $t_H$ wherein the waveform produced by pulse current source 550 is at its maximum value $V_H$ determines the current through sense resistor 206 (and hence through battery 508 and individual cells 204, 510, 512, and 514). Thereafter, during the next time interval $t_L$ MCU 502 determines the voltages, internal resistances, and energy stored in individual cells 204, 510, 512, and 514 of battery 508 in rapid succession. Thereafter, the stored charges of individual cells 204, 510, 512, and 514 of battery 508 can be summed to get the total charge stored in battery 508.

To test battery cell 204, MCU 502, during a time interval $t_L$ at which the waveform pulse current source 550 is at a voltage minimum $V_L$, directs analog MUX 516 (which is a type of integrated circuit having a built-in voltage meter, such MUXes being known in the art) to connect across the positive terminal of battery cell 204 and the negative terminal of battery cell 204, read or measure the voltage across battery cell 204, and deliver the measured voltage over cell voltage measurement line 518 to MCU 502. MCU 502 then uses the measured voltage and the previously determined current value gleaned via use of sense resistor 206 to calculate the internal resistance of battery cell 204. The determined internal resistance and voltage of battery cell 204 are then utilized to determine the energy stored in battery cell 204 via a table look-up process substantially similar to those described in relation to FIGS. 2 and 4. Thereafter, the energy stored in battery cell 204 is saved in a memory of MCU 502.

Subsequent to the determination of energy stored in battery cell 204, and during the time interval $t_L$, MCU 502 directs analog MUX 516 to connect across the positive terminal of battery cell 510 and the negative terminal of battery cell 510. Thereafter, the internal resistance and voltage of battery cell 510 is determined utilizing a process substantially similar to that described for cell 204 of battery 508 (i.e., utilizing the measured voltage across battery cell 510 and the previously determined current value gleaned utilizing sense resistor 206 in order to ultimately determine the charge stored in battery 510 via look-up table reference). Thereafter, the energy stored in battery cell 510 is added to the previously stored count of the energy stored in battery cell 204 and the total resulting from the addition is saved in a memory of MCU 502.

Subsequent to the determination of energy stored in battery cell 204 and battery cell 510, and during the time interval $t_L$, MCU 502 directs analog MUX 516 to connect across the positive terminal of battery cell 512 and the negative terminal of battery cell 512. Thereafter, the internal resistance and voltage of battery cell 512 is determined utilizing a process substantially similar to that described for battery cell 204 of battery 508 (i.e., utilizing the measured voltage across battery cell 512 and the previously determined current value gleaned utilizing sense resistor 206 in order to ultimately determine the charge stored in battery cell 512 via look-up table reference). Thereafter, the energy stored in battery cell 512 is added to the previously stored count of the energy stored in battery cell 204 and battery cell 510 and the total resulting from the addition is saved in a memory of MCU 502.

Subsequent to the determination of energy stored in battery cell 204, battery cell 510, and battery cell 512, and during the time interval $t_L$, MCU 502 directs analog MUX 516 to connect across the positive terminal of battery cell 514 and the negative terminal of battery cell 514. Thereafter, the internal resistance and voltage of battery cell 514 is determined utilizing a process substantially similar to that described for battery cell 204 of battery 508 (i.e., utilizing the measured voltage across battery cell 514 and the previously determined current value gleaned utilizing sense resistor 206 in order to ultimately determine the charge stored in battery cell 514 via look-up table reference). Thereafter, the energy stored in battery cell 514 is added to the previously stored count of the energy stored in battery cell 204, battery cell 510 and battery cell 512 and the total resulting from the addition is saved in a memory of MCU 502.

Since individual battery cells 204, 510, 512, and 514 make up battery 508, the sum total of their individual energies equates to the energy stored in battery 508. Accordingly, this sum can be passed by MCU 502 to other display devices or programs in a manner analogous to that described in relation to method step 410.

Notice that although the foregoing described the determination of the energy stored in a battery made up of four cells, the example discussed above can be easily generalized to a battery composed of N (where N is some positive integer) number of cells. In addition, as discussed above, each battery can have associated with it a lookup table, which can be stored either in MCU 502 memory or in on-battery memory such that it is accessible to MCU 502.

The above description is intended to be illustrative of the invention and should not be taken to be limiting. Other embodiments within the scope of the present invention are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims It will be understood by those within the art that if a specific number of an introduced claim element is intended, such an intent will be explicitly recited in the claim, and in the absence of such recitation no such limitation is present. For non-limiting example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when same claim includes the introductory phrases "one or more" or "at least one" and indefinite articles such as "a" or "an"; the same holds true for the use of definite articles used to introduce claim elements.

What is claimed is:

1. A method of determining the capacity of a battery, the method comprising:
   (a) applying a first voltage to the battery during a first interval;
   (b) acquiring battery operational data during the first interval;
   (c) applying a second voltage to the battery during a second interval;
   (d) acquiring battery operational data during the second interval;
   (e) determining a value of a first battery characteristic from the battery operational data that is acquired during the first interval; and
   (f) determining a value of a second battery characteristic from the battery operational data that is acquired during the second interval.

2. A method as defined in claim 1, further comprising:
   based on the value of the first battery characteristic and on the value of the second battery characteristic, reading a corresponding battery capacity from a compilation of battery capacity data.

3. A method as defined in claim 2, wherein the first voltage is a voltage that is greater than an expected fully-charged battery voltage and the second voltage is a voltage that is less than an expected fully-discharged battery voltage.

4. A method as defined in claim 3, wherein the first battery characteristic is battery internal resistance.

5. A method as defined in claim 4, wherein the second battery characteristic is battery voltage.

6. A method as defined in claim 5, wherein battery capacity data are stored in a two-dimensional matrix and battery capacity values in the matrix correlate to respective value pairs comprising a value of battery internal resistance and a value of battery voltage.

7. A method as defined in claim 6, wherein a battery capacity is read by matching determined values of battery internal resistance and battery voltage to matrix values of battery internal resistance and battery voltage.

8. A method as defined in claim 1, wherein steps (a), (c) and (e) are performed repeatedly and an average value of the first battery characteristic is determined.

9. A method as defined in claim 8, wherein steps (b), (d) and (f) are performed repeatedly and an average value of the second battery characteristic is determined.

10. A method as defined in claim 9, wherein based on the average value of the first battery characteristic and on the average value of the second battery characteristic, a corresponding battery capacity is read from a compilation of battery capacity data.

11. A method as defined in claim 10, wherein the first voltage is a voltage that is greater than an expected fully-charged battery voltage and the second voltage is a voltage that is less than an expected fully-discharged battery voltage.

12. A method as defined in claim 11, wherein the first battery characteristic is battery internal resistance.

13. A method as defined in claim 12, wherein the second battery characteristic is battery voltage.

14. A method as defined in claim 13, wherein battery capacity data are stored in a two-dimensional matrix and battery capacity values in the matrix correlate to respective value pairs comprising a value of battery internal resistance and a value of battery voltage.

15. A battery charge determination device comprising:
   first means for applying a first signal level to a battery during a first interval and for applying a second signal level to the battery during a second interval;
   second means for determining a value of a first battery characteristic from battery operational data acquired during the first interval;
   third means for determining a value of a second battery characteristic from battery operational data acquired during the second interval; and
   a memory device that stores battery charge data that corresponds to values of the first battery characteristic and values of the second battery characteristic.

16. A battery charge determination device as defined in claim 15, wherein the first signal level is a voltage that is greater than an expected fully-charged battery voltage and the second signal level is a voltage that is less than an expected fully-discharged battery voltage.

17. A battery charge determination device as defined in claim 16, wherein the first battery characteristic is battery internal resistance.

18. A battery charge determination device as defined in claim 17, wherein the second battery characteristic is battery voltage.

19. A battery charge determination device as defined in claim 18, wherein battery charge data are stored in a two-dimensional matrix and battery charge values in the matrix correlate to respective value pairs comprising a value of battery internal resistance and a value of battery voltage.

20. A battery charge determination device as defined in claim 15, wherein the memory device stores battery charge data in an array that includes columns and rows, wherein each column corresponds to a value of the first battery characteristic and each row corresponds to a value of the second battery characteristic.

21. A battery charge determination device as defined in claim 20, wherein the first battery characteristic is battery internal resistance and the second battery characteristic is battery voltage.

22. A battery charge determination device as defined in claim 21, wherein the second means includes a resistor for sensing a battery current.

23. A battery charge determination device as defined in claim 22, wherein the third means includes a voltmeter for measuring a battery voltage.

24. A battery charge determination device as defined in claim 20, wherein battery charge data entries in the array are determined by:
   (a) applying a first voltage to the battery during a first interval;
   (b) acquiring battery operational data during the first interval;

(c) applying a second voltage to the battery during a second interval;

(d) acquiring battery operational data during the second interval;

(e) determining a value of a first battery characteristic from the battery operational data that is acquired during the first interval; and (f) determining a value of a second battery characteristic from the battery operational data that is acquired during the second interval.

25. A computer system comprising;

a processor;

power management means coupled to the processor for monitoring a battery condition and responding thereto; and a battery charge determination device coupled to the power management means, the battery charge determination device COMPRISING:

first means for applying a first signal level to a battery during a first interval and for applying a second signal level to the battery during a second interval;

second means for determining a value of a first battery characteristic from battery operational data acquired during the first interval;

third means for determining a value of a second battery characteristic from battery operational data acquired during the second interval; and a memory device that stores battery charge data that corresponds to values of the first battery characteristic and values of the second battery characteristic.

26. A computer system as defined in claim 25, wherein the memory device stores battery charge data in an array that includes columns and rows, wherein each column corresponds to a value of the first battery characteristic and each row corresponds to a value of the second battery characteristic.

27. A computer system as defined in claim 26, wherein the first battery characteristic is battery internal resistance and the second battery characteristic is battery voltage.

28. A computer system as defined in claim 27, wherein the second means includes a resistor for sensing a battery current.

29. A computer system as defined in claim 28, wherein the third means includes a voltmeter for measuring a battery voltage.

* * * * *